(12) United States Patent
Dieckmann et al.

(10) Patent No.: US 9,274,435 B2
(45) Date of Patent: Mar. 1, 2016

(54) ILLUMINATION SYSTEM OR PROJECTION OBJECTIVE OF A MICROLITHOGRAPHIC PROJECTION EXPOSURE APPARATUS

(75) Inventors: Nils Dieckmann, Huettlingen (DE); Damian Fiolka, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 504 days.

(21) Appl. No.: 12/415,173

(22) Filed: Mar. 31, 2009

(65) Prior Publication Data
US 2009/0195766 A1 Aug. 6, 2009

Related U.S. Application Data

(63) Continuation of application No. PCT/EP2007/063553, filed on Dec. 7, 2007.

(30) Foreign Application Priority Data

Dec. 21, 2006 (DE) .......................... 10 2006 061 846
Jun. 14, 2007 (DE) .......................... 10 2007 027 985

(51) Int. Cl.
*G03F 7/20* (2006.01)
*G02B 27/28* (2006.01)

(52) U.S. Cl.
CPC .......... *G03F 7/70216* (2013.01); *G02B 27/281* (2013.01); *G02B 27/286* (2013.01); *G03F 7/70091* (2013.01); *G03F 7/70566* (2013.01)

(58) Field of Classification Search
CPC .. G02B 27/281; G02B 27/286; G02B 5/3025; G02B 5/3083; G03F 7/70091; G03F 7/70191; G03F 7/70216; G03F 7/70566

USPC .................... 355/53, 67, 71, 52, 55; 359/501
See application file for complete search history.

(56) References Cited

U.S. PATENT DOCUMENTS

| | | | |
|---|---|---|---|
| 2,269,713 A * | 1/1942 | Erwin ............................ | 352/214 |
| 3,736,857 A | 6/1973 | Williamson et al. | |
| 6,636,295 B2 | 10/2003 | Shiozawa | |
| 8,801,305 B2 * | 8/2014 | Yasugi ................. | G02B 27/281 396/505 |
| 2004/0240073 A1* | 12/2004 | Gerhard ........................ | 359/649 |
| 2005/0174528 A1* | 8/2005 | Kubo et al. ................... | 349/193 |
| 2005/0195480 A1 | 9/2005 | Brown et al. | |
| 2006/0023307 A1* | 2/2006 | Giordano ...................... | 359/489 |

(Continued)

FOREIGN PATENT DOCUMENTS

| | | |
|---|---|---|
| EP | 1 653 282 | 5/2006 |
| EP | 1 720 199 | 11/2006 |

(Continued)

OTHER PUBLICATIONS

Office Action corresponding to Chinese Patent Application No. CN 200780047864.7, dated Sep. 21, 2010.

(Continued)

*Primary Examiner* — Toan Ton
*Assistant Examiner* — Mona M Sanei
(74) *Attorney, Agent, or Firm* — Fish & Richardson P.C.

(57) ABSTRACT

The disclosure relates to an optical system, such as an illumination system or a projection objective of a microlithographic projection exposure apparatus, including such an optical system having a polarization-influencing optical arrangement which permits enhanced flexibility in affording a desired polarization distribution.

36 Claims, 15 Drawing Sheets

(56) References Cited

U.S. PATENT DOCUMENTS

| | | | |
|---|---|---|---|
| 2006/0092398 A1 | 5/2006 | McCarthy | |
| 2006/0152701 A1* | 7/2006 | Totzeck et al. | 355/71 |
| 2006/0170901 A1 | 8/2006 | Tanitsu et al. | |
| 2006/0171138 A1* | 8/2006 | Muramatsu et al. | 362/29 |
| 2006/0192937 A1 | 8/2006 | Kerkhof et al. | |
| 2006/0268208 A1* | 11/2006 | Murakami et al. | 349/117 |
| 2007/0146676 A1 | 6/2007 | Tanitsu et al. | |
| 2008/0043236 A1 | 2/2008 | Kaise et al. | |

FOREIGN PATENT DOCUMENTS

| | | |
|---|---|---|
| JP | 2006-005267 | 1/2006 |
| JP | 2006-135324 | 5/2006 |
| JP | 2006-237617 | 9/2006 |
| WO | WO 03/077011 | 9/2003 |
| WO | WO 2005/031467 | 4/2005 |
| WO | WO 2005/069081 | 7/2005 |
| WO | WO 2006/016584 | 2/2006 |
| WO | WO 2006/077849 | 7/2006 |
| WO | WO 2006/087041 | 8/2006 |

OTHER PUBLICATIONS

Chinese Office Action, with English translation, for corresponding CN Appl No. 2007-80047864.7, dated Jan. 6, 2012.
Chinese Office Action, with English translation, for corresponding CN Appl No. 20078004786.7, dated Jul. 23, 2012.
Japanese Office Action, with English translation, for corresponding JP Appl No. 2009-541966, dated Jun. 5, 2012.
Chinese Office Action, with English translation, for corresponding CN Appl No. 200780047864.7, dated Nov. 30, 2012.
Japanese Office Action, with English translation, for corresponding JP Appl No. 2009-541966, dated Jul. 30, 2013.
Korean Office Action, with translation, for corresponding KR Appl No. 10-2009-7012562, dated Nov. 14, 2013.
Taiwanese Office Action, with translation, for corresponding TW Appl No. 96148846, dated Sep. 16, 2013.
Korean office action with English translation thereof, for KR Appl No. 10-2014-7003966, dated Apr. 29, 2014.
Taiwanese office action with English translation thereof, for TW Appl No. 96148846, dated Apr. 11, 2014.
Korean Office Action, with translation, for KR Appl No. 10-2009-7012562, dated Jun. 27, 2014.
Korean Office Action, with translation thereof, for KR Application No. 10-2014-7003966, dated Oct. 31, 2014.
Japanese Office Action, with translation thereof, for JP Appl No. 2014-211508, dated Oct. 29, 2015.

* cited by examiner

ILLUMINATION SYSTEM OR PROJECTION OBJECTIVE OF A MICROLITHOGRAPHIC PROJECTION EXPOSURE APPARATUS

CROSS-REFERENCE TO RELATED APPLICATIONS

This application is a continuation of, and claims benefit under 35 USC 120 to, International Application No. PCT/EP2007/063553, filed Dec. 7, 2007, which claims benefit of German Application No. 10 2006 061 846.7, filed Dec. 21, 2006 and German Application No. 10 2007 027 985.1, filed Jun. 14, 2007. International Application No. PCT/EP2007/063553 is hereby incorporated by reference.

FIELD

The disclosure relates to an optical system, such as an illumination system or a projection objective of a microlithographic projection exposure apparatus, including such an optical system having a polarization-influencing optical arrangement which permits enhanced flexibility in affording a desired polarization distribution.

BACKGROUND

Microlithography is used for the production of microstructured components such as for example integrated circuits or LCDs. The microlithography process is typically carried out in what is commonly referred to as a projection exposure apparatus having an illumination system and a projection objective. The image of a mask illuminated by the illumination system (=reticle) is in that case projected by the projection objective on to a substrate (for example a silicon wafer) which is coated with a light-sensitive layer (photoresist) and arranged in the image plane of the projection objective in order to transfer the mask structure on to the light-sensitive coating on the substrate.

SUMMARY

In some embodiments, the disclosure provides an optical system, such as an illumination system or a projection objective of a microlithographic projection exposure apparatus, which has enhanced flexibility in providing a desired polarization distribution.

In certain embodiments, an optical system, such as an illumination system or a projection objective of a microlithographic projection exposure apparatus, includes at least one polarization-influencing optical arrangement which has at least two polarization-influencing optical elements of optically active material. At least one of the polarization-influencing elements can be arranged rotatably.

Using at least two polarization-influencing optical elements of optically active material, where at least one of the polarization-influencing elements is arranged rotatably, can allow for the possibility of variably positioning those polarization-influencing optical elements via rotation as desired in the optical system and possibly providing for mutual superimposition thereof to a differing degree in the beam path. This can result in a relatively high level of flexibility in terms of adjustability of polarization distributions. For example, overlap regions of the two polarization-influencing optical elements in the beam path can be created, avoided, or specifically altered simply by rotating the element(s) to produce different overall rotational effects depending on whether incident light passes through none, one or both of the polarization-influencing optical elements, depending, in part at least, on the overall thickness of optically active material which is afforded by the superimpositioning of the elements.

In some embodiments, it is possible to use almost the entire pupil area as a desired defined polarization state or a defined polarization distribution can be achieved substantially over the entire pupil plane.

In some embodiments, each of the polarization-influencing elements is arranged rotatably. Optionally, the polarization-influencing elements may be arranged rotatably independently of each other.

In certain embodiments, the at least two polarization-influencing optical elements are each of a constant thickness which is optionally selected so that each of those elements causes a rotation of the polarization direction of linearly polarized light through 90° or through an odd multiple thereof. In such embodiments, when passing through both polarization-influencing elements, the polarization state is consequently rotated through 180°. With that configuration variations in the respective rotational position of the polarization-influencing elements make it possible, from initially linearly polarized light of a constant polarization direction, to create a plurality of different polarization distributions, in which respect individual regions of the pupil can be rotated in different ways with respect to the polarization direction thereof either through 90° (when passing only through one of the elements) or can remain unchanged (when passing through both elements or through none of the elements).

In some embodiments, the polarization-influencing optical arrangement is arranged at least in the immediate proximity of a pupil plane of the optical system.

In certain embodiments, there is at least one neutral position for the polarization-influencing optical arrangement in which the at least two polarization-influencing optical elements leave the polarization state of the light passing through the arrangement substantially unaltered. This can provide the advantage that the overall arrangement can remain permanently in the optical system even if for example no change in the polarization state is desired.

In some embodiments, there is at least one position for the polarization-influencing optical arrangement in which the desired polarization direction of linearly polarized light impinging on the arrangement is rotated through 90°. That makes it possible in a flexible fashion to select a setting as a 90° retarder which, by virtue of the action of the polarization-influencing optical arrangement between two portions of an optical system, is suitable for implementing compenzation of the phase jumps which occur in the respective portions (for example as a consequence of reflection phenomena at mirrors). In that case two mutually perpendicular polarization states are interchanged by the action of the polarization-influencing optical arrangement as a 90° retarder so that summing of the phase jumps in the second portion precisely cancels out same in the first portion.

In certain embodiments, the at least two polarization-influencing optical elements are arranged in such a way that the optically active surface thereof in the beam path of the optical system is of a respective geometry which is in the shape of a sector of a circle and optionally semicircular. In such embodiments, the at least two polarization-influencing optical elements are optionally arranged rotatably in such a way that the optically active surfaces thereof supplement each other in at least one rotational position of the polarization-influencing optical elements, to constitute an overall circular surface (in plan view or as a projection). As a consequence of the semicircular geometry of the respective optically active surfaces of the polarization-influencing elements, suitable rotation of those elements makes it possible to produce regions of a geometry in the shape of a segment of a circle and with mutually different polarization directions. Those polarization distributions firstly include what is referred to as "quasi-tangential" polarization distribution (also referred to as "X-Y-polarization") which, in a polarization distribution which is tangential in a first approximation, includes a light component with a desired polarization direction in the X-direction and a light component with a desired polarization direction in the Y-direction, wherein those two light components can be in conformity in particular both with respect to their overall surface area occupied in the light beam cross-section and also with respect to their intensity (here the X-axis and the Y-axis are assumed to be mutually perpendicular axes of a Cartesian co-ordinate system, wherein the Z-axis which is perpendicular to the X-axis and the Y-axis extends parallel to the optical system axis or the light propagation direction).

The polarization distributions which can be produced however also include polarization distributions with magnitudes of the vertical and horizontal poles, which are varied in relation to the above-defined distribution and with respect to which therefore the light components with the desired polarization direction in the X-direction and with the desired polarization direction in the Y-direction are not in conformity with respect to their total area occupied in the light beam cross-section and with respect to their intensity respectively. In other words, the polarization-influencing optical arrangement can also create polarization distributions with respect to which the relative size relationships of the areas present in the light beam cross-section, with a constant desired polarization direction, can be continuously varied.

In some embodiments, the polarization-influencing optical arrangement has a further optical element of birefringent crystal material having an optical crystal axis oriented perpendicularly to the optical system axis. Optionally, the further optical element is arranged rotatably about the optical system axis. Furthermore that further optical element optionally has a lambda/4 plate or an arrangement of lambda/4-plates. That further optical element can be arranged only in a central partial region of the light beam passing through the polarization-influencing optical arrangement.

This design configuration makes it possible to produce polarization distributions in which circularly polarized light or also effectively unpolarized light is produced in a central region of the pupil (the size of that region depending on the extent of the further optical element).

In that respect the disclosure makes use of the fact that circularly polarized light passes through the optically active material in an uninfluenced condition with respect to the polarization state as the circularly polarized state represents an inherent state of the optically active material. Furthermore, via rotation of the further optical element (lambda/4-plate), it is possible to adjust the orientation of the optical crystal axis thereof relative to the polarization direction of the light impinging on the arrangement, in other words, the lambda/4-plate can be displaced between a position in which it converts the linear entrance polarization into circular polarization and a position in which it leaves the linear entrance polarization unchanged.

In some embodiments, the further optical element can also have a matrix-like or chessboard-like arrangement of lambda/4-plates. In that case the individual regions of that matrix or chessboard-like arrangement can have optical crystal axes which are rotated through 90° relative to each other so that the regions in question convert the linear entrance polarization alternately into right-circularly and left-circularly polarized light respectively, from which unpolarized light is set in the central region of the pupil by superimpositioning of the components in the imaging process.

The above-described exploitation of the general principle whereby circularly polarized light passes through the optically active material without being influenced with respect to the polarization state as the circularly polarized state represents an inherent state of the optically active material is not limited to the polarization-influencing arrangement but can also be implemented generally in other arrangements or optical systems.

In some embodiments, the disclosure provides an illumination system of a microlithographic projection exposure apparatus, in which different illumination settings can be set in the illumination system and wherein a polarization distribution present in the illumination system can be adapted to the respectively set illumination setting by rotation of at least one optical element.

In such embodiments, the illumination settings can differ by the size and/or the shape of illumination poles produced, in which case the polarization distribution can be continuously adapted to the size and/or the shape of those illumination poles.

In some embodiments, at least one of those illumination settings is an annular illumination setting.

In certain embodiments, the at least one optical element is made from optically active material.

In some embodiments, the disclosure also concerns a method of setting the polarization distribution in at least one illumination pole, in particular in an optical system or in an illumination system having the above-described features, wherein setting of the polarization distribution is effected by rotation of at least one optical element.

In some embodiments, the disclosure provides an optical system, such as an illumination system or a projection objective of a microlithographic projection exposure apparatus, that includes at least one optical element of optically active material. The optical element can be so arranged that in operation of the optical system it is irradiated at least region-wise with circularly polarized light.

In certain embodiments, the disclosure provides a method of operating an optical system, such as an illumination system or a projection objective of a microlithographic projection exposure apparatus. The system can have at least one optical element of optically active material, where the optical system is irradiated at least region-wise with circularly polarized light.

In some embodiments, the disclosure provides a microlithographic projection exposure apparatus, a method of microlithographic production of microstructured components and a microstructured component.

Further configurations of the disclosure are set forth in the description and the appendant claims.

DESCRIPTION OF DRAWINGS

The disclosure is described in greater detail hereinafter via embodiments by way of example illustrated in the accompanying drawings in which.

DETAILED DESCRIPTION

Figure 1:
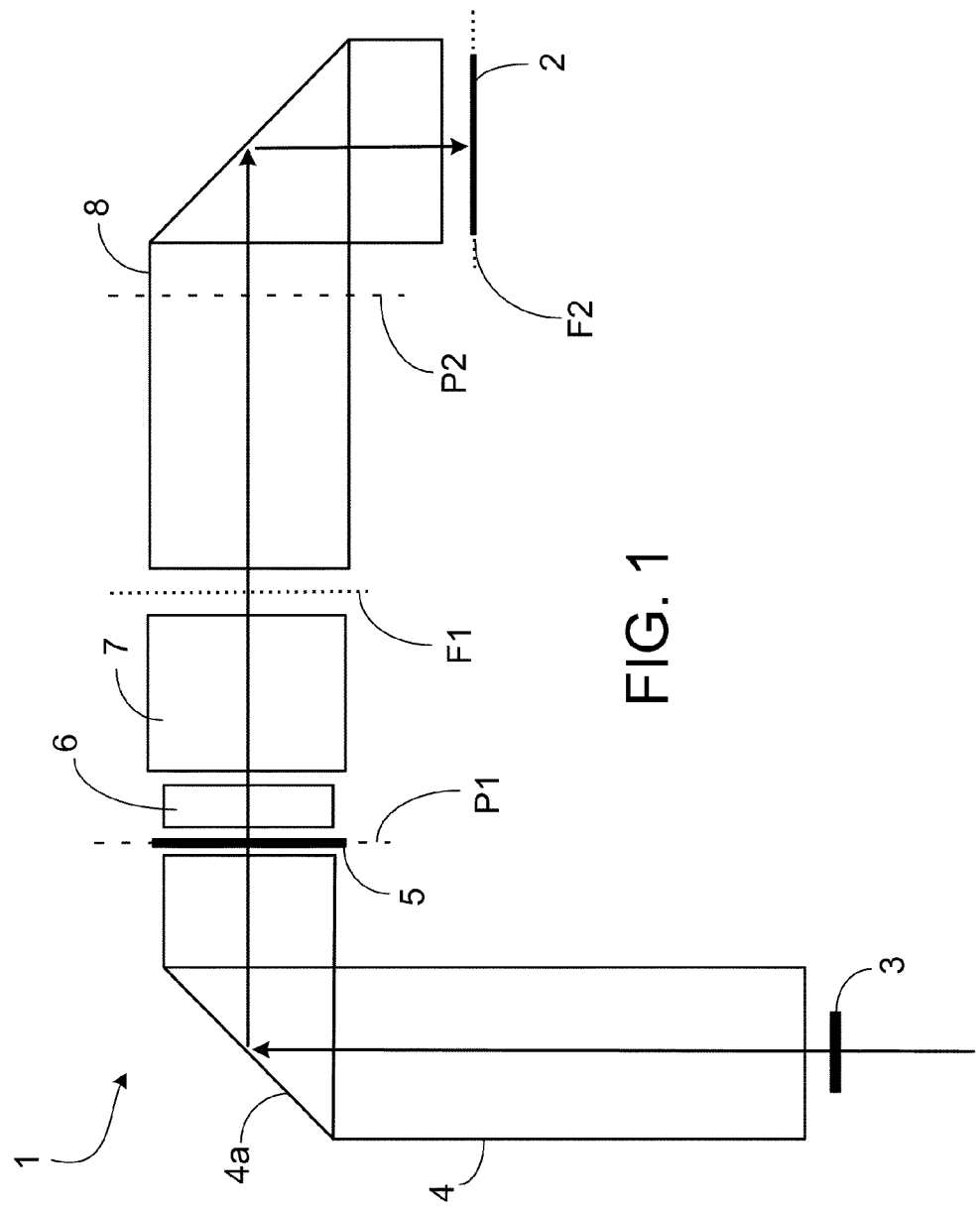
FIG. 1 is a diagrammatic view of the structure of an illumination system of a microlithographic projection exposure apparatus.

FIG. 1 is a diagrammatic view showing the structure in principle of an illumination system of a microlithographic exposure apparatus.

The illumination system 1 serves for the illumination of a structure-bearing mask (reticle) 2 with light from a light source unit (not shown) which includes for example an ArF laser for a working wavelength of 193 nm and a beam-forming optical system generating a parallel light beam.

The parallel light beam of the light source unit firstly impinges on a diffractive optical element 3 (also referred to as the 'pupil defining element') which produces a desired intensity distribution (for example dipole or quadrupole distribution) by way of an angular radiation characteristic defined by the respective diffracting surface structure in a pupil plane P1. As shown in FIG. 1 disposed downstream of the diffractive optical element 3 in the light propagation direction is an optical unit 4 which has a zoom objective producing a parallel light beam of variable diameter, and an axicon. Different illumination configurations are produced via the zoom objective in conjunction with the upstream-disposed diffractive optical element 3, in the pupil plane P1, depending on the respective zoom position and position of the axicon elements. The optical unit 4 further includes a direction-changing mirror 4a.

A polarization-influencing optical arrangement 5 is disposed in the pupil plane P1. This arrangement can involve any of the configurations described hereinafter of a polarization-influencing optical arrangement.

Disposed downstream of the polarization-influencing optical arrangement 5 in the light propagation direction in the beam path is a light mixing device 6 which in per se known manner has an arrangement including microoptical elements suitable for producing a light mixture. The light mixing device can also involve a honeycomb condenser or a bar integrator of material which is transparent for light at the working wavelength such as for example quartz glass or also crystalline calcium fluoride.

The light mixing device 6 is followed in the light propagation direction by a lens group 7, downstream of which is a field plane F1 with a reticle masking system (REMA), the image of which is produced on the structure-bearing mask (reticle) 2 arranged in the field plane F2, by an REMA objective 8 at a downstream position in the light propagation direction, and which thereby delimits the illuminated region on the reticle 2. The structure-bearing mask 2 is imaged with a projection objective (not shown here) on to a wafer or a substrate provided with a light-sensitive layer.

Figure 2:
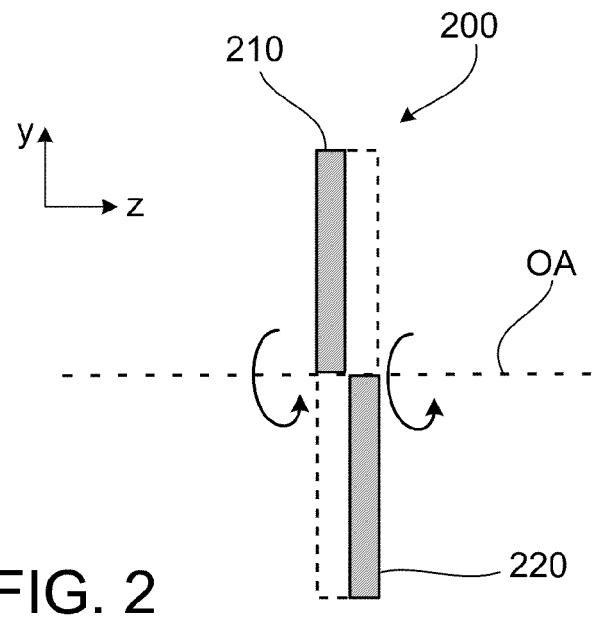
FIG. 2 is a diagrammatic side view of the structure of a polarization-influencing optical arrangement.

Referring to FIG. 2, shown therein is a merely diagrammatic side view of a polarization-influencing optical arrangement 200. The polarization-influencing optical arrangement 200 includes a first polarization-influencing optical element 210 and a second polarization-influencing optical element 220 which are arranged rotatably independently of each other about a common axis of rotation (which coincides with the optical system axis OA). Implementation of that rotatable arrangement can be effected for example by the optical elements 210, 220 each involving a respective extent beyond the optically used area and by being held in their respective region which is not optically used in a holding element (not shown) for example by way of a clamping mounting or an adhesive mounting which in turn is rotatable by way of a (optionally actuable) rotating device. In some embodiments, only one of the polarization-influencing optical elements 210 and 220 is arranged rotatably.

The two polarization-influencing optical elements 210 and 220 are each produced in the form of planar plates from optically active crystalline quartz, wherein the optical crystal axis of the respective crystal material is oriented in parallel relationship with the above-mentioned axis of rotation (that is to say also with the optical system axis, corresponding to the z-axis in the illustrated co-ordinate system). Furthermore the polarization-influencing optical elements 210, 220 are each in the form of planar plates of constant thickness, the thickness being so selected that the elements 210, 220 produce rotation of the polarization direction of linearly polarized light through 90° or an odd multiple thereof. When using synthetic, optically active crystalline quartz with a specific rotational capability α of about 323.17 mm at a wavelength of 193 nm and at a temperature of 21.6° C., that condition corresponds to a thickness of the polarization-influencing optical elements 210, 220 of 278.5 μm or an odd multiple thereof. For natural quartz, for comparative purposes, optical activity was determined for example with respect to $O_a$ (natural quartz)=325.2±0.57 mm (at ambient temperature between 20° C. and 25° C., wherein a temperature dependency was ascertained on $\Delta O_a/\Delta T$=2.37 mrad/(mm ° C.)±0.14 mrad/(mm ° C.).

The polarization-influencing optical elements 210 and 220, the geometry of which can basically be selected as desired (for example in the form of circular plates or rectangular plates) are so arranged in the beam path that the optically effective surface of each of those elements 210, 220, in the beam path of the optical system, is respectively of a semicircular geometry. In the diagrammatic views in FIGS. 3b-3k, those respective optically effective surfaces of the elements 210, 220 are shown by hatchings which differ from each other, wherein an overlap region which is present in dependence on the respective rotational position of the individual elements 210, 220 is identified by corresponding doubled hatching. These views also show the polarization distribution which is set by the action of the elements 210, 220 downstream of the polarization-influencing optical arrangement 200 in the light propagation direction, more specifically by way of the direction of the arrows indicating the respective desired polarization direction. Accordingly those arrows are only shown here as single arrows (and not as double arrows) in order better to illustrate the actual rotational angle, in which respect however for example a rotation of the entrance polarization through a rotational angle of 180° ultimately leaves the polarization distribution unaltered.

Figure 3A:
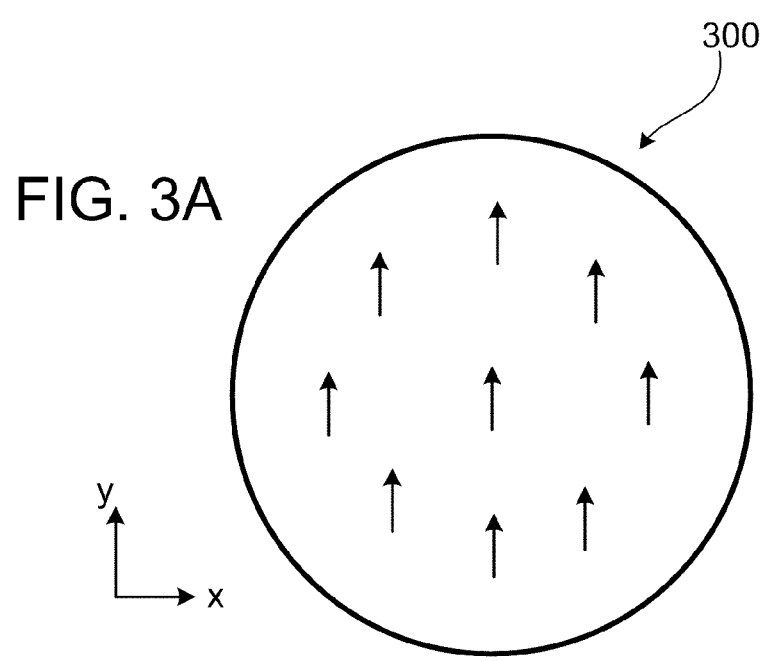
FIGS. 3a-3k show diagrammatic views to illustrate the polarization distributions which can be obtained for a predetermined entrance polarization distribution (FIG. 3a) by different rotational positions of the polarization-influencing optical elements of FIG. 2 (FIGS. 3b-3k)
Figure 3B:
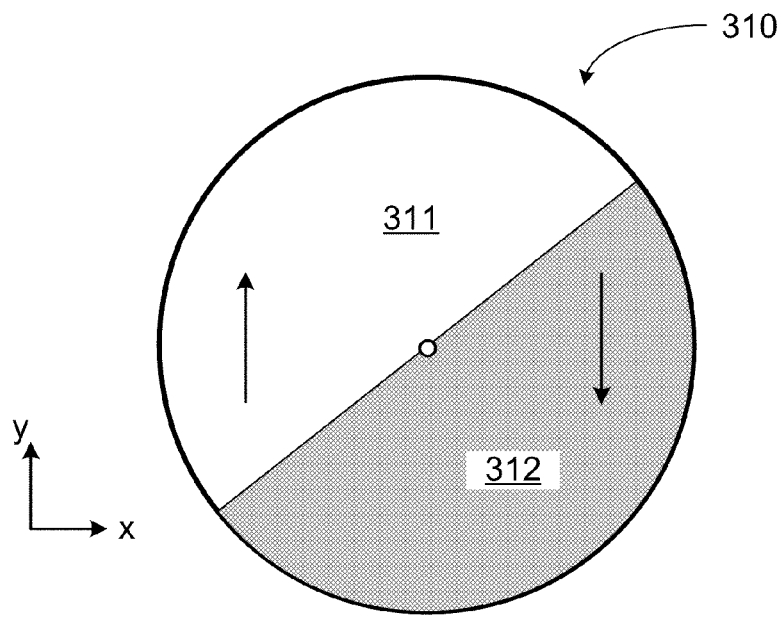
Figure 3C:
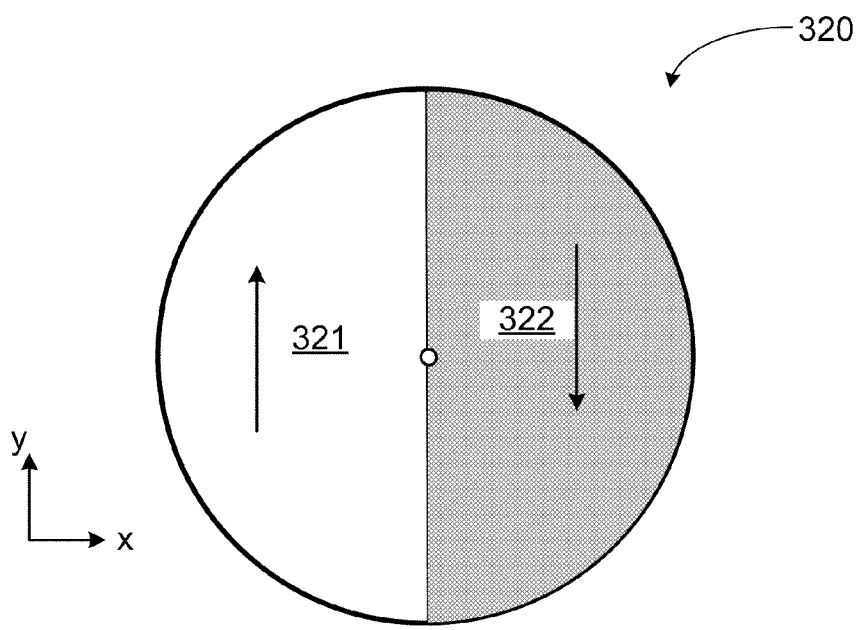

In the arrangements 310 and 320 respectively shown in FIGS. 3b and 3c the polarization-influencing elements 210 and 220 are so positioned that they overlie each other completely. Consequently as a result there is a semicircular region 311 and 321 respectively with a polarization direction which is unaltered behind the polarization-influencing optical arrangement 200 with respect to the entrance polarization (facing in the Y-direction in FIG. 3a), and an also semicircular region 312 and 322 respectively in which the polarization direction has been rotated through 180°. Accordingly therefore both with the setting shown in FIG. 3b and also with that shown in FIG. 3c, with respect to the action of the polarization-influencing optical arrangement 200, the exit polarization distribution corresponds to the entrance polarization distribution so that each case involves a neutral position of the arrangement 200, which does not alter the polarization distribution.

Figure 3D:
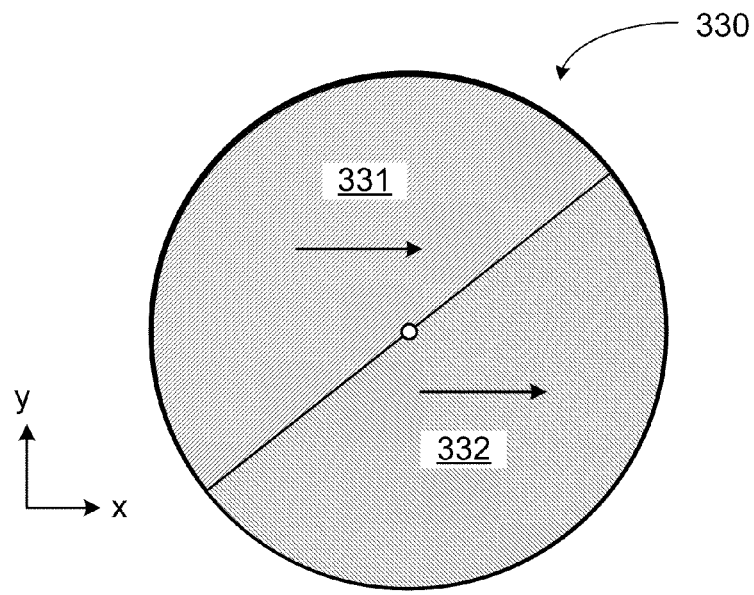
Figure 3E:
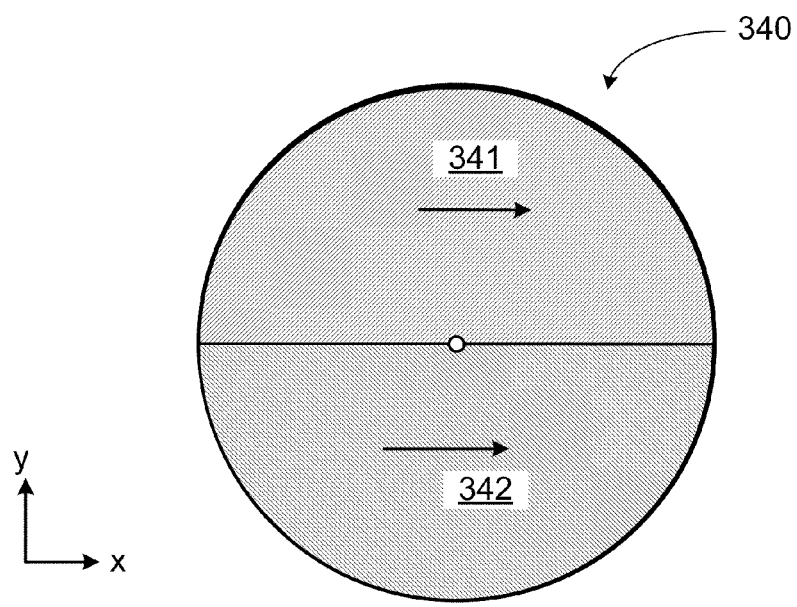

In FIG. 3d and FIG. 3e the positions of the polarization-influencing optical elements 210 and 220 are so selected that the optically effective surfaces thereof do not overlap but supplement each other to afford a circular overall surface (in plan view or as a projection). Consequently rotation of the polarization direction through 90° takes place in each two respective semicircular regions 331 and 332, and 341 and 342 respectively. Such a setting is particularly suitable when the action of the polarization-influencing optical arrangement, between two portions of an optical system, is intended to implement compenzation of the phase jumps occurring in the respective portions of the optical system, for example as a consequence of reflection phenomena at mirrors. In this case, two mutually perpendicular polarization states are interchanged by the action of the polarization-influencing optical arrangement as a 90° retarder so that summing of the phase jumps in the second portion precisely cancels out that in the first portion. That principle of reducing/compensating for an unwanted change in the polarization state is known for example from WO 03/077011 A1 and can thus also be implemented with the polarization-influencing optical arrangement.

Figure 3F:
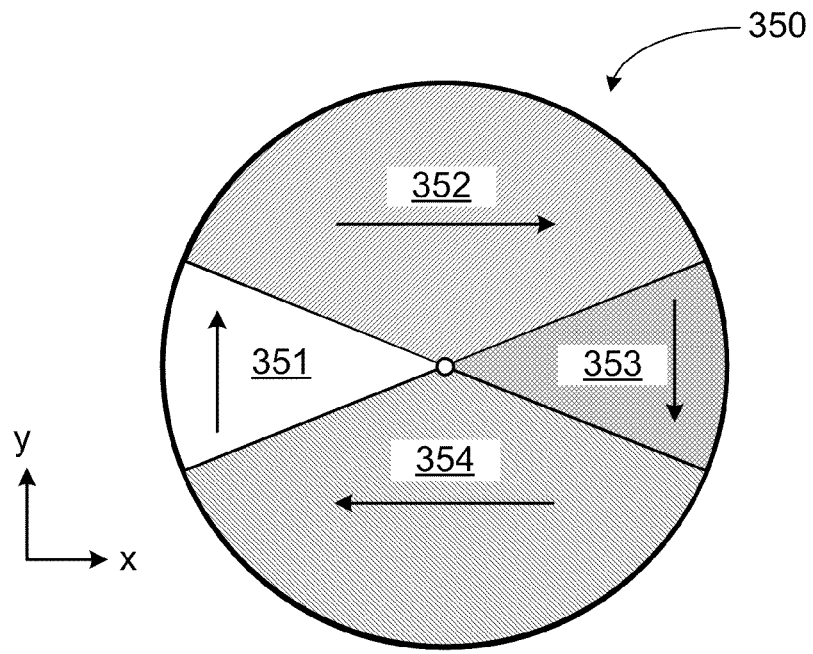
Figure 3G:
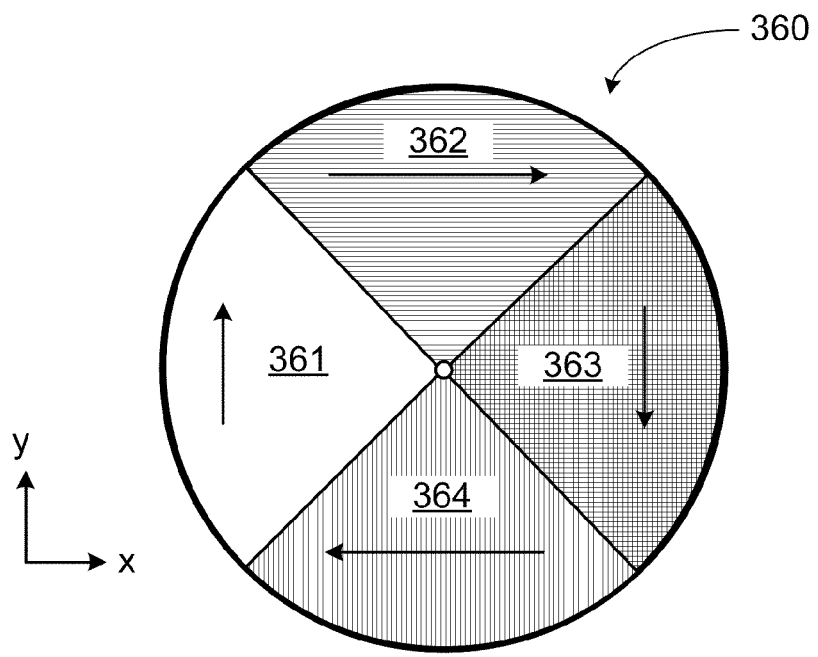

The arrangement 360 shown in FIG. 3g of the polarization-influencing optical elements 210 and 220 is so selected that they do not overlap in two regions 362 and 364 which are in mutually opposite relationship in the Y-direction (that is to say vertically) (so that there in each case rotation of the polarization direction through 90° takes place). In contrast the two elements 210 and 220 overlap in a region 363 so that there the polarization direction is rotated through 180°. In the region 361 in opposite relationship to the region 363 in the X-direction none of the elements 210 and 220 respectively is in the beam path so that no rotation of the polarization direction takes place there at all. The polarization distribution obtained as the outcome is referred to as 'quasi-tangential' or 'X-Y-polarization' as so to speak in a first approximation it includes tangential polarization distribution with a light component with a desired polarization direction in the X-direction and a light component with a desired polarization direction in the Y-direction. In the case of the arrangement 360 of FIG. 3g those two light components are in conformity both with respect to their total surface occupied in the light beam cross-section and also with respect to their intensity.

Figure 3H:
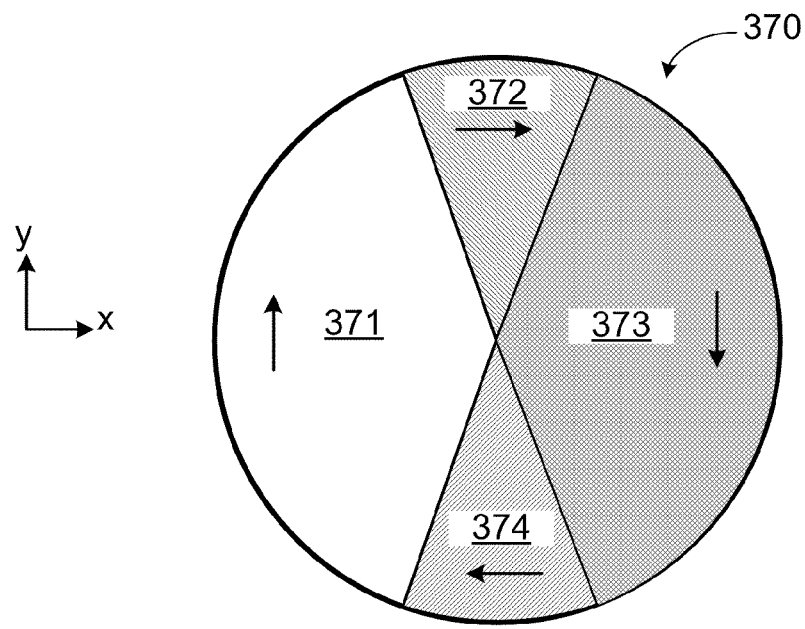

The arrangements shown in FIGS. 3f and 3h are each so selected that the overlap region of the elements 210, 220 and the region which is covered by none of the elements 210 or 220 respectively are respectively smaller (FIG. 3f, regions 351, 353) or larger (see FIG. 3h, regions 371, 373) than the regions respectively covered only by one of the elements 210, 220 (that is to say in FIG. 3f the regions 352 and 354 and in FIG. 3h the regions 372 and 374). Consequently the light components with a desired polarization direction in the X-direction and with a desired polarization direction in the Y-direction are not in conformity with respect to their total area occupied in the light beam cross-section and their intensity respectively. Varying the magnitude of the overlap region 353 and 373 respectively makes it possible to continuously vary the size of the individual poles or the areas present in the light beam cross-section, with a constant desired polarization direction.

Figure 3I:
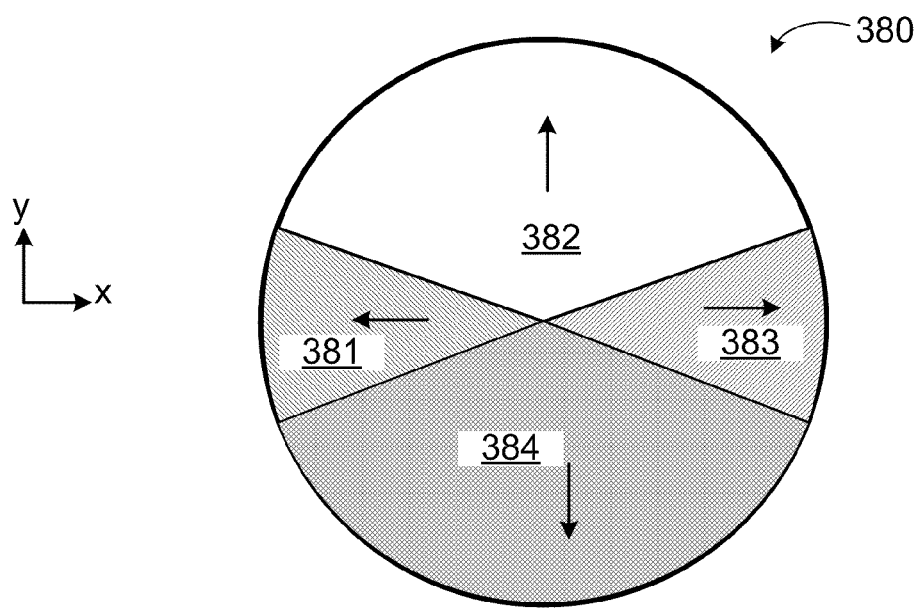
Figure 3J:
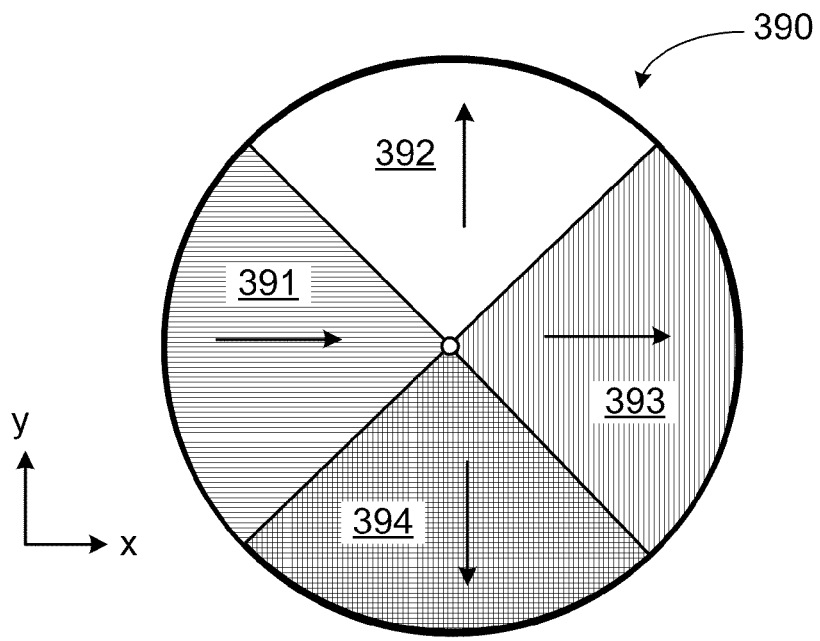
Figure 3K:
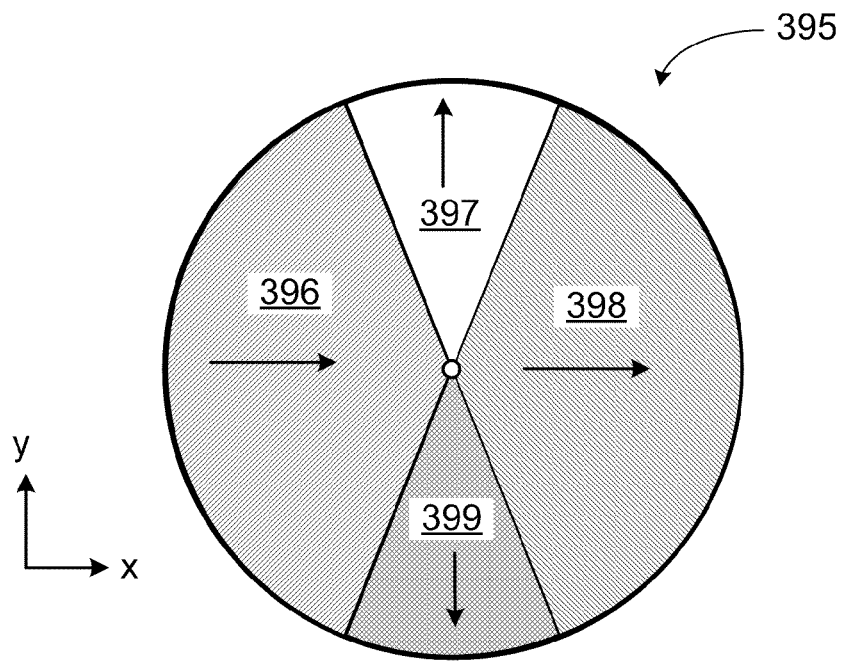

In the arrangement 390 shown in FIG. 3j of the elements 210 and 220, the non-overlapping regions of the elements 210 and 220 are disposed horizontally in opposite relationship in the X-direction, whereas in the vertically oppositely disposed regions 392 and 394 the elements 210 and 220 either overlap (region 394) or are not present at all (region 392). As a result the arrangement 390 of FIG. 3j produces what is referred to as a 'quasi-radial' polarization distribution in which the desired polarization direction, on the X-axis and the Y-axis respectively, is oriented in parallel relationship with the radius directed towards the optical system axis OA. Similarly to the above-described embodiments of FIGS. 3f and 3h, the embodiments of FIGS. 3i and 3k are modified in relation to the above-described arrangement 390 of FIG. 3j in such a way that the pole size or the area of the surfaces which are present in the light beam cross-section and which are in opposite relationship in the X-direction and in the Y-direction respectively is varied with a constant desired polarization direction.

Figure 6:
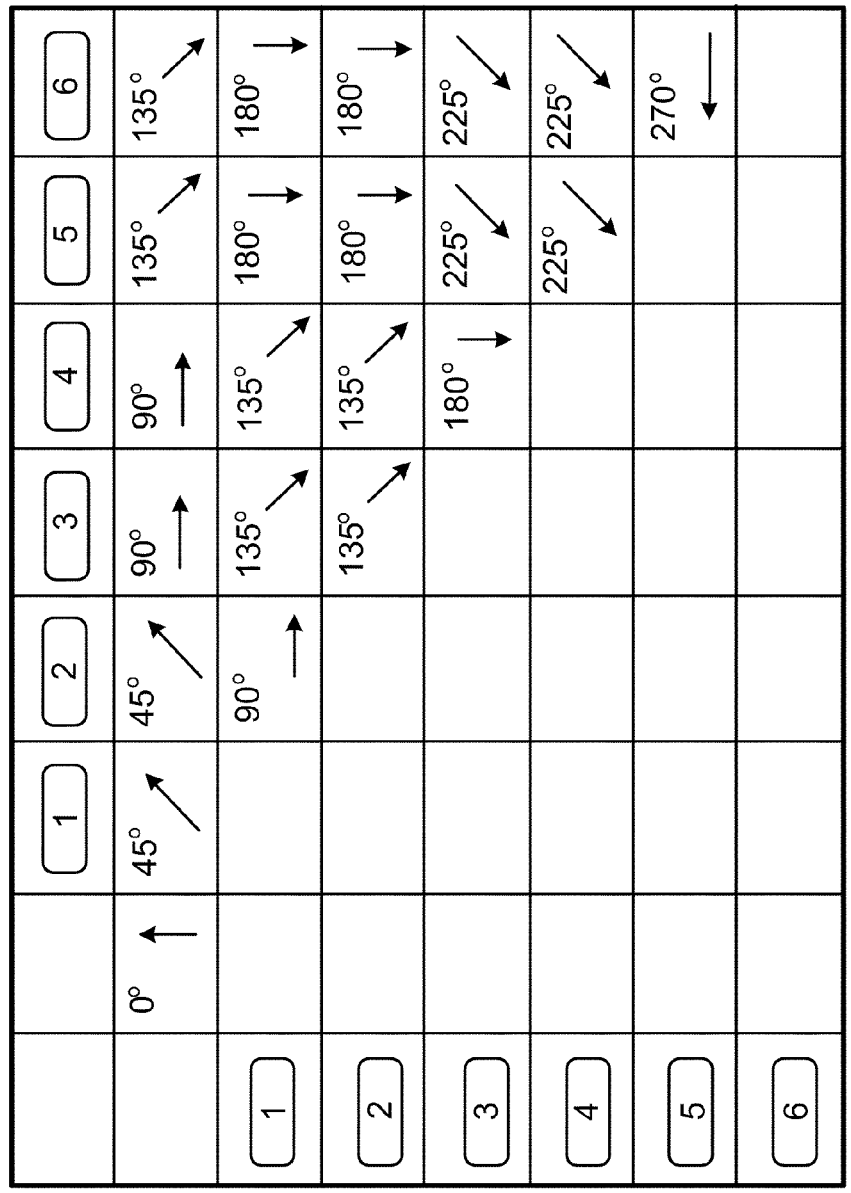
FIG. 6 shows an overview of the resulting overall rotations which can be achieved with a combination of two respective superposed elements.

Hereinafter reference is now made to FIGS. 6 and 7a-7p to describe embodiments of a polarization-influencing optical arrangement. This arrangement differs from the polarization-influencing arrangement 200 described with reference to FIGS. 2 and 3 in that a total of six polarization-influencing elements are arranged in succession along the optical system axis OA and are arranged to be rotatable about the optical system axis OA (forming a common axis of rotation). Each of those elements (made from optically active, crystalline quartz with an optical crystal axis parallel to the optical system axis OA) is of a constant thickness and, unlike FIGS. 2 and 3, is not in the shape of a semicircle but a quarter of a circle. The corresponding arrangement is shown as a plan view for example in FIG. 7a (as well as FIG. 7c, FIG. 7e, and so forth), in which respect the digits '1', '1+2', '2+3' and so forth identify the respective element present in the circular sector in question or the elements which overlap there. As is already the case in the example of FIGS. 2 and 3, rotation of the individual elements takes place about the centre point of the associated full circle. The thickness of the individual polarization-influencing elements is so selected that the two elements which are first in the light propagation direction respectively produce a rotation of the polarization direction of linearly polarized light through 45° or an odd multiple thereof. The next two elements which follow in the light propagation direction (that is to say the third and fourth elements of the arrangement) are of such a thickness that they produce a rotation of the polarization direction of linearly polarized light through 90°. The two elements which further follow in the light propagation direction (that is to say the fifth and sixth elements of the arrangement) respectively cause a rotation of the polarization direction of linearly polarized light through 135°.

As was already described via the example of FIGS. 2 and 3, the polarization state when passing through a plurality of plates is rotated by the sum of the individual rotations of the plates through which the light respectively passes.

That arrangement achieves a further increase in flexibility in terms of providing a desired polarization state, as described hereinafter. FIG. 6 firstly shows an overview of the resulting overall rotations which can be achieved with a combination of two respective superposed elements. In that case the individual polarization-influencing elements are consecutively numbered from '1' to '6' and the rotational angle resulting when light passes through those two plates is specified in degrees and also in the form of an arrow symbol.

Figure 7A:
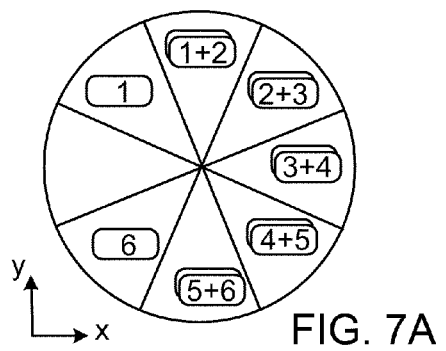
FIGS. 7a-7p show configurations of six polarization-influencing optical elements together with the respectively produced exit polarization distributions.
Figure 7B:
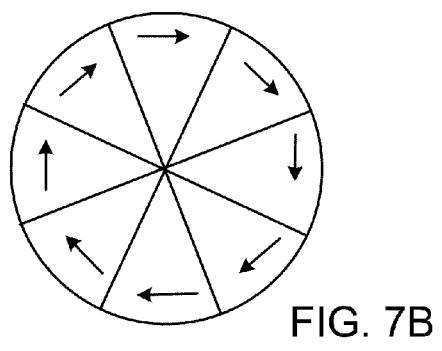
Figure 7C:
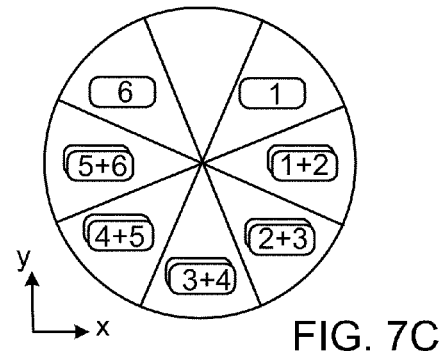
Figure 7D:
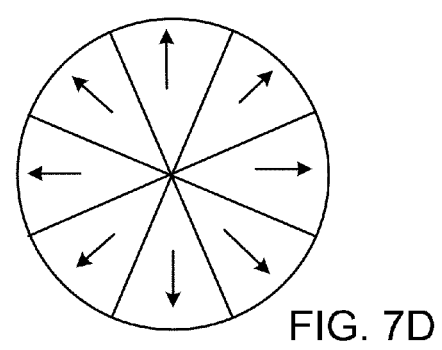
Figure 7E:
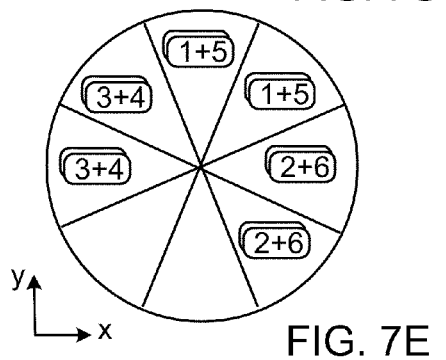
Figure 7F:
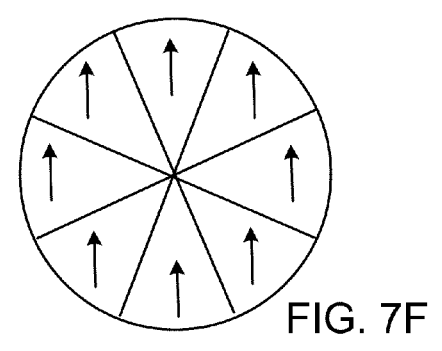
Figure 7G:
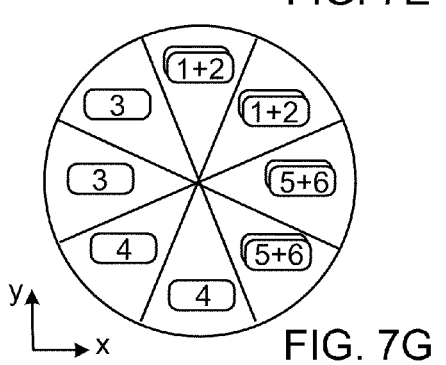
Figure 7H:
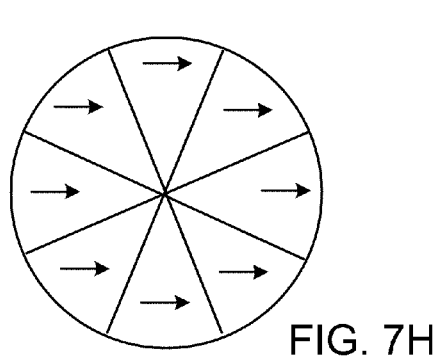
Figure 7I:
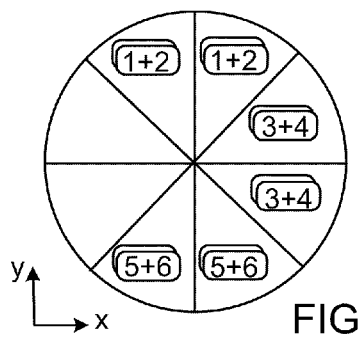
Figure 7J:
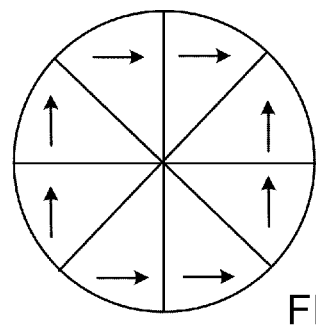
Figure 7K:
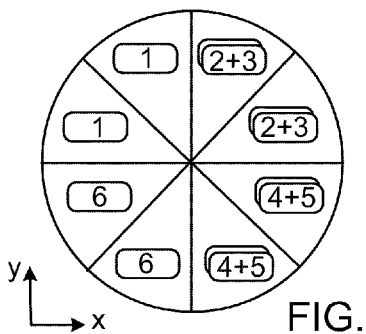
Figure 7L:
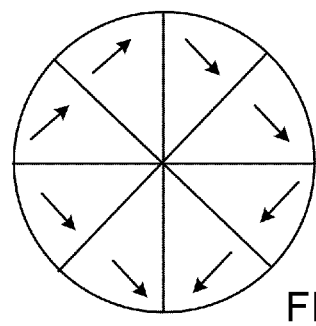
Figure 7M:
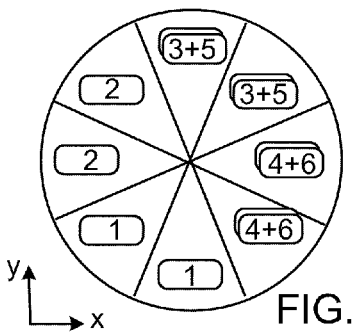
Figure 7N:
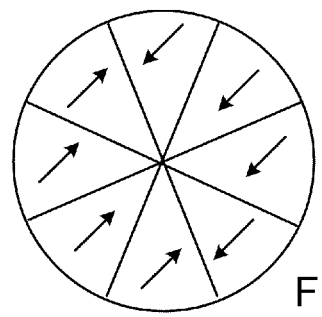
Figure 7O:
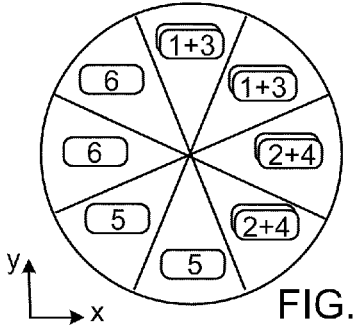
Figure 7P:
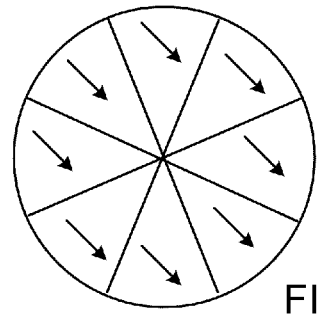

FIGS. 7a-7p now show, for these embodiments of the polarization-influencing optical arrangement, a total of eight different configurations of the six polarization-influencing optical elements together with the respectively produced exit polarization distribution. In that respect FIG. 7b shows the exit polarization distribution related to the configuration of FIG. 7a, FIG. 7d shows the exit polarization distribution associated with the configuration of FIG. 7c, and so forth. In all cases the respective entrance polarization distribution corresponds to that of FIG. 3a and FIG. 5a respectively, that is to say a linear polarization distribution with a desired polarization direction in the Y-direction.

The configurations of FIG. 7a and FIG. 7c respectively are suitable for producing a quasi-tangential polarization distribution (FIG. 7a, b) and a quasi-radial polarization distribution (FIG. 7c, d respectively), which is still better approximated to the ideal tangential and radial polarization distribution respectively, in comparison with FIGS. 3g and 3j respectively.

The configuration of FIGS. 7e-7f corresponds to a neutral position which as a result does not influence the polarization state. The configuration of FIGS. 7g-7h corresponds to a regular rotation of the desired polarization direction through 90° and thus similarly to the above-described configurations of FIG. 3d and FIG. 3e is suitable for minimising a remaining degree of residual polarization in unpolarized operation.

The configuration of FIGS. 7i-7j, similarly to FIG. 3g, corresponds to the production of a quasi-tangential X-Y-polarization which, in accordance with the further possible configuration of FIGS. 7k-7l, can also be produced rotated through 45° about the optical system axis OA.

The configurations of FIGS. 7m-7n and FIGS. 7o-7p respectively accordingly correspond to a uniform rotation of the desired polarization direction through 45° (FIGS. 7m-7n) and through 135° (FIGS. 7o-7p) respectively.

Hereinafter, with reference to FIG. 4 and FIGS. 5a-5c, a polarization-influencing optical arrangement will be described. This polarization-influencing optical arrangement 400 firstly has the two polarization-influencing optical elements 210 and 220 of the arrangement 200 of FIG. 2 and FIG. 3. In addition and arranged upstream of that arrangement 200 in the light propagation direction (along the z-axis in the illustrated co-ordinate system), as a component part of the arrangement 400 however, there is a further optical element 410 of birefringent crystal material in which the optical crystal axis is oriented perpendicularly to the optical system axis OA, in contrast to the elements 210 and 220. Optical element 410 is in the form of a lambda/4-plate and is also arranged rotatably about the common axis of rotation of the elements 210 and 220 (which is coincident with the optical system axis OA) and independently of the elements 210 and 220. In addition the element 410 involves a circular geometry and is of a diameter which is approximately 50% of the diameter of the light beam passing through the arrangement (that is to say for example about 50% of the maximum pupil diameter).

Figure 4:
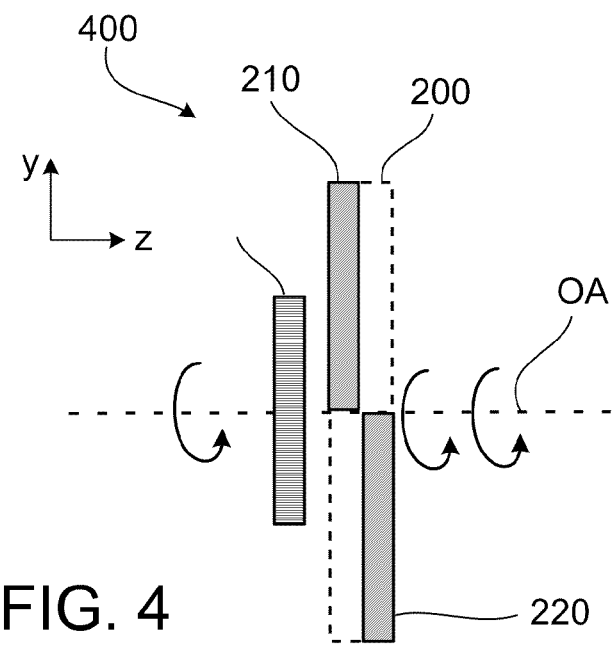
FIG. 4 shows a diagrammatic side view to illustrate the structure of a polarization-influencing optical arrangement.
Figure 5A:
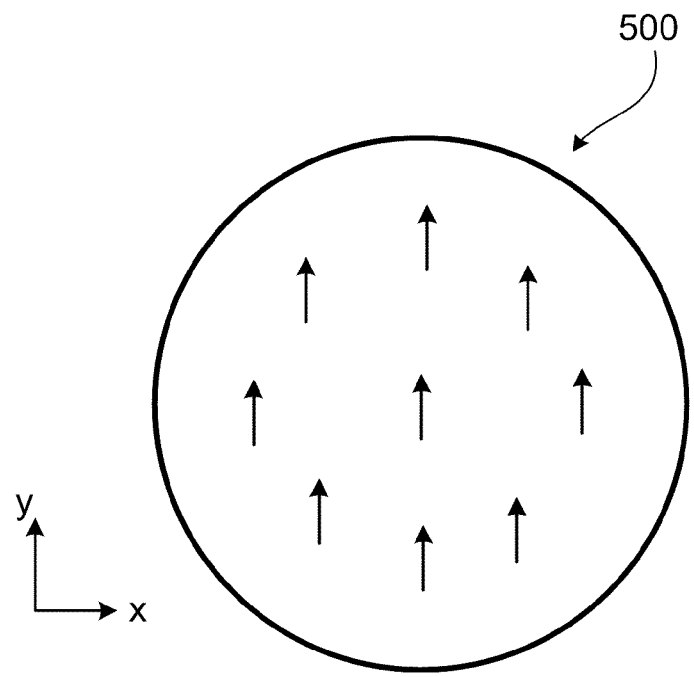
FIGS. 5a-5d show diagrammatic views to illustrate the polarization distributions which can be obtained for a predetermined entrance polarization distribution (FIG. 5a) by different rotational positions of the polarization-influencing optical elements of FIG. 4 (see FIGS. 5b-5c), and a configuration of a polarization-influencing optical arrangement (FIG. 5d)
Figure 5B:
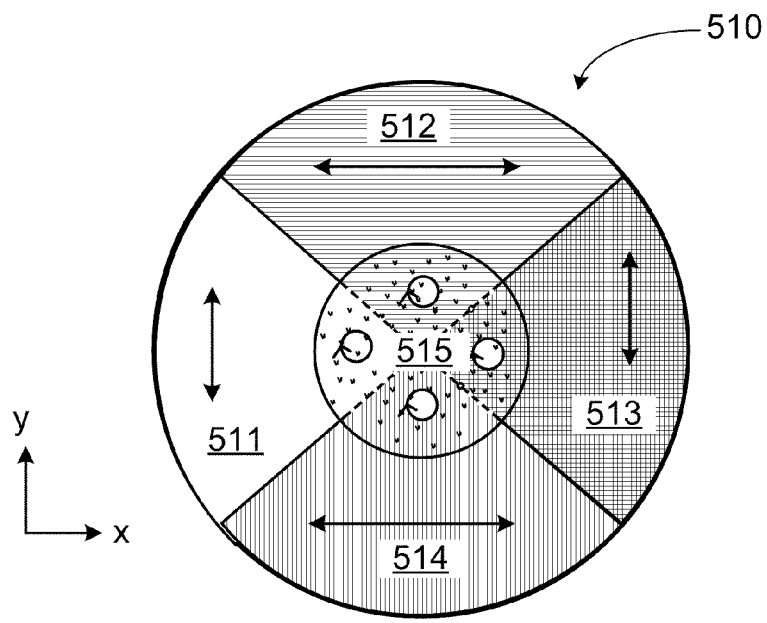
Figure 5C:
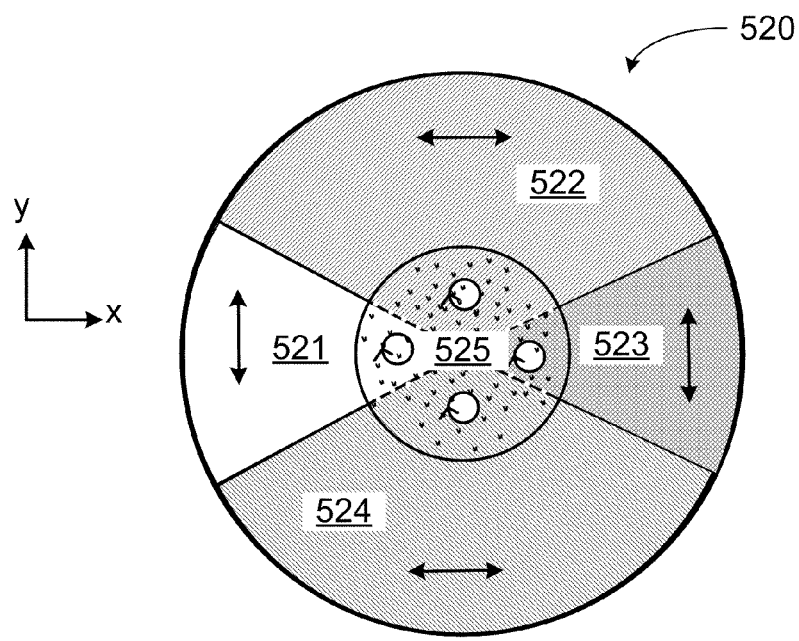

As shown in FIGS. 5a-5c, in accordance with the arrangement 400 of FIG. 4, it is possible to produce from the original linear entrance polarization distribution with a constant polarization direction (see FIG. 5a), exit polarization distributions which by virtue of the action of the lambda/4-plate in a central region of the pupil (the size of which depends on the extent of the optical element 410) produce circularly polarized light. In that respect the effect which comes in useful is that the circularly polarized light produced by the lambda/4-plate passes through the subsequent elements 210, 220 without influencing the polarization state as the circularly polarized state represents an inherent state of the optically active material. As the aforethe action of producing circularly polarized light from the linear entrance polarization distribution presupposes that the optical crystal axis in the element 410 is at an angle of substantially 45° relative to the desired polarization direction in the linear entrance polarization distribution, the above-mentioned effect of producing circular polarization can also be modified or suppressed via rotation of the element 410 about the optical system axis OA. The optical element 410 does not have any polarization-influencing action if the optical crystal axis in the element 410 is parallel to the desired polarization direction of the linear entrance polarization (that is to say in the illustrated co-ordinate system in the y-direction) as that polarization direction forms an inherent state in relation to the birefringent material of the lambda/4-plate.

In that sense the configuration shown in FIG. 5b in which the rotational position of the plates and also the exit polarization distribution are illustrated similarly to the view in FIG. 3 corresponds to the production of a quasi-tangential polarization distribution similarly to FIG. 3g, but with a circular polarization distribution in a central region 515 of the pupil. The arrangement 520 shown in FIG. 5c, similarly to FIG. 3f, corresponds to the production of an also quasi-tangential polarization distribution with a differing size with respect to the horizontal poles 521, 523 in comparison with the vertical poles 522, 524, and with a circular polarization distribution in a central region 525 of the pupil. Similarly, for all of the configurations already described with reference to FIGS. 2 and 3, via the polarization-influencing optical arrangement 400 of FIG. 4, it is possible to produce corresponding exit polarization distributions involving circular polarization in the central region of the pupil, that is to say the production of circular polarization in the central region of the pupil is effected independently of the position of the other polarization-influencing elements or rotator plates.

It will be appreciated moreover that the principle of a lambda/4-plate arranged upstream of the polarization rotators or polarization-influencing elements in the direction of propagation of the light can also be applied to the arrangement described with reference to FIGS. 6 and 7 in order to produce the exit polarization distributions shown in detail in FIGS. 7a-7p in each case similarly with a circular polarization distribution in the central region of the pupil.

Figure 5D:
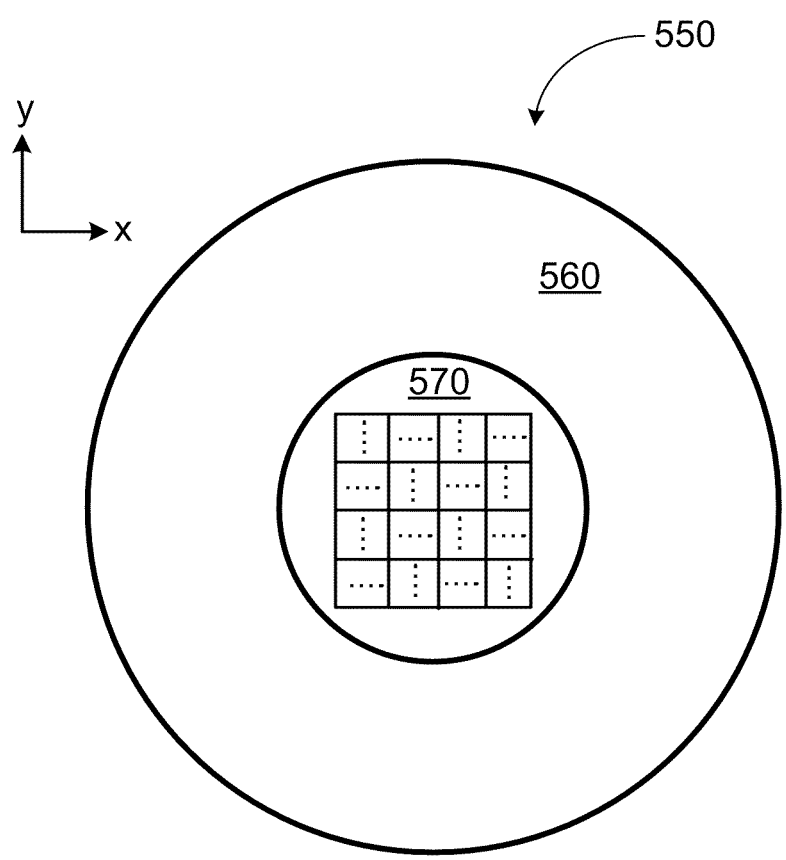

In some embodiments, the further optical element 410, as shown in the diagrammatic view of FIG. 5d, in place of a lambda/4-plate, may also have a matrix-like or chessboard-like arrangement 570 of lambda/4-plates, in which case mutually adjacently arranged lambda/4-plates of that matrix-like arrangement respectively have optical crystal axes which are rotated through 90° relative to each other, wherein moreover similarly to FIG. 4 the arrangement is positioned for example upstream of the polarization-influencing arrangement 200 (identified by 560 in FIG. 5d) in the light propagation direction and can also arranged rotatably about the optical system axis OA extending in the Z-direction. In certain embodiments, the further optical element 410 may also involve a matrix-like or chessboard-like distribution of polarization-influencing elements, in which case respective adjacent elements in that distribution alternately produce a lambda/4- and a (3*lambda/4)-retardation.

Optionally, in the above-described matrix-like arrangements the 'inversely' birefringent regions are arranged in point symmetry around the pupil centre. As a consequence of the superimpositioning of the individual components in the imaging process both configurations respectively permit the production of quasi-unpolarized light in the central region of the pupil. In these configurations also, the above-described action of the matrix-form arrangement can be respectively 'switched on and off via rotation about 45°, through the optical system axis forming the axis of rotation. That configuration with a matrix-like or chessboard-like arrangement of lambda/4-plates (or (3*lambda/4)-plates) can also be combined with each of the polarization-influencing arrangements described hereinbefore (with reference to FIGS. 2, 3 and FIGS. 6, 7 respectively).

Figure 8A:
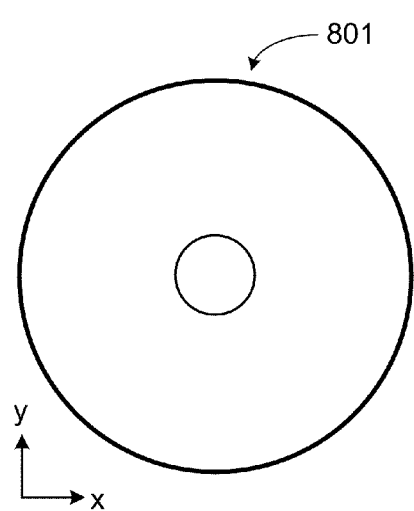
FIGS. 8a-8e show diagrams to illustrate different illumination settings which can be set in an optical system.
Figure 8B:
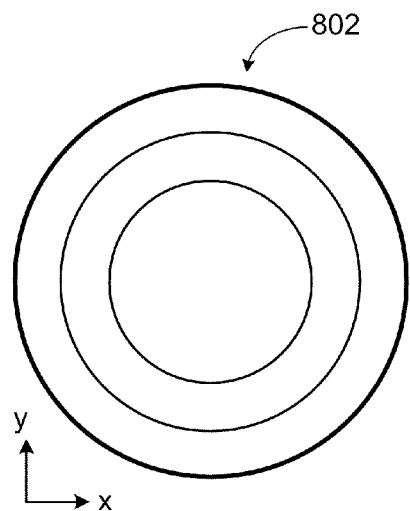
Figure 8C:
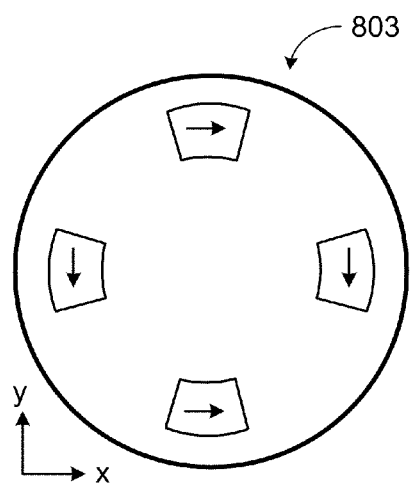
Figure 8D:
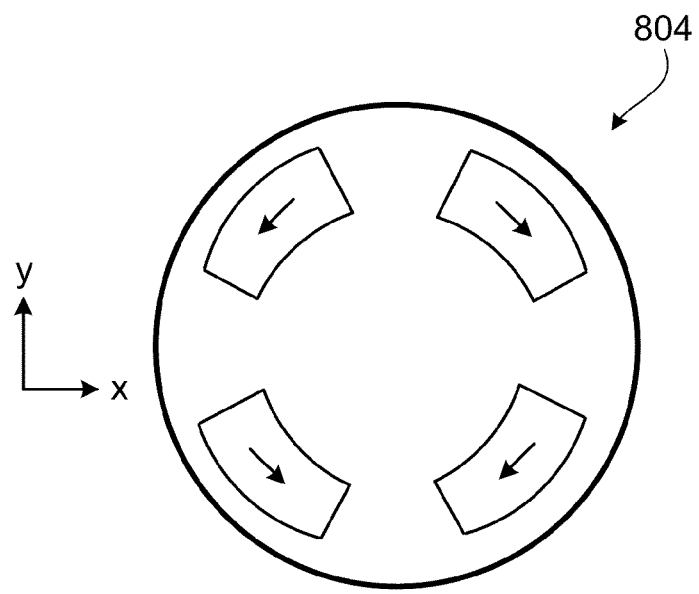
Figure 8E:
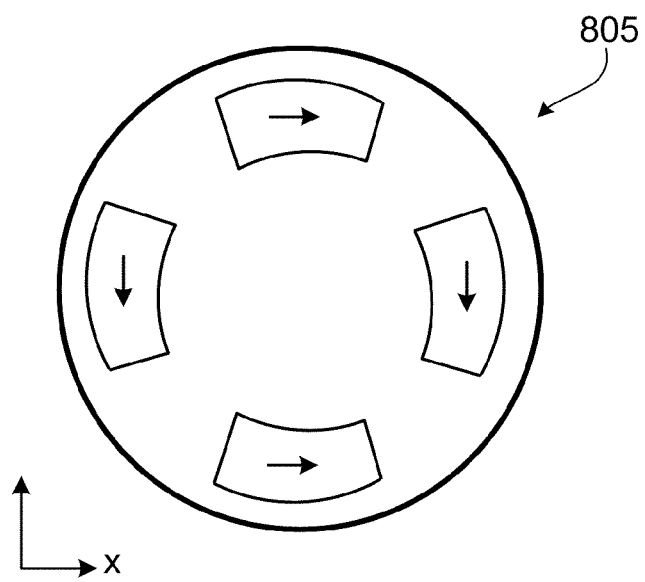

FIGS. 8*a-e* show typical illumination settings which can be set in an optical system, for example an illumination system as shown in FIG. 1 and which for example are desired in accordance with the respective mask used, wherein FIG. 8*a* shows a so-called illumination setting with 'small sigma' (also referred to as small sigma setting), FIG. 8*b* shows an annular illumination setting, FIG. 8*c* shows a quadrupole illumination setting also referred to as C-quad setting and FIG. 8*d* shows an illumination setting also referred to as quasar setting, in which the four poles of the quadrupole are arranged rotated relative to the C-quad setting through 45° in each case in relation to the x-axis and the y-axis respectively about the z-axis. FIG. 8*e* shows an illumination setting similar to FIG. 8*c*, but with an altered size of the poles disposed in opposite relationship in the x-direction ('horizontal' poles). A polarization-influencing optical arrangement can be used in particular in order to adapt the polarization distribution which is respectively set or present in the illumination system, in terms of the pole size, continuously to the respectively set illumination setting, that is to say to the size and/or shape of the illumination poles, by rotating at least one of the polarization-influencing optical elements.

If the disclosure has been described hereinafter with reference to certain embodiments, numerous variations and alternative configurations will be apparent to the man skilled in the art, for example by combination and/or interchange of features of individual embodiments. Accordingly it will be apparent to the man skilled in the art that such variations and alternative configurations are also embraced by the present disclosure and the scope of the disclosure is restricted only in accordance with the accompanying claims and equivalents thereof.

What is claimed is:
1. An optical system, comprising:
  a polarization-influencing optical arrangement, comprising:
    first and second polarization-influencing optical elements comprising optically active material,
  wherein:
    at least one of the first and second polarization-influencing optical elements is rotatable so that the polarizing-influencing arrangement has a first position and a second position;
    in the first position of the polarization-influencing optical arrangement, the first and second polarization-influencing optical elements have a first rotational positioning relative to each other;
    in the second position of the polarization-influencing optical arrangement, the first and second polarization-influencing optical elements have a second rotational positioning relative to each other;
    the first rotational positioning is different from the second rotational positioning;
    the optical system is an illumination system or a projection objective of a microlithographic projection exposure apparatus;
    during use of the optical system a light beam passes through the polarization-influencing optical arrangement;
    in the first position of the polarization-influencing arrangement, a cross-section of an entire portion of the light beam passing through both the first and second polarization-influencing optical elements has a first size; and
    in the second position of the polarization-influencing arrangement, a cross-section of an entire portion of the light beam passing through both the first and second polarization-influencing optical elements has a second size which is different from the first size.

2. An optical system according to claim 1, wherein each of the first and second polarization-influencing optical elements is rotatable.

3. An optical system according to claim 2, wherein each of the first and second polarization-influencing optical elements is respectively rotatable in a plane perpendicular to an optical system axis of the optical system.

4. An optical system according to claim 2, wherein the first and second polarization-influencing optical elements are rotatable about a common axis of rotation.

5. An optical system according to claim 4, wherein the optical system has an optical system axis which is coincident with the common axis of rotation.

6. An optical system according to claim 1, wherein at least one of the first and second polarization-influencing optical elements is rotatable in a plane perpendicular to an optical system axis of the optical system.

7. An optical system according to claim 1, wherein each of the first and second polarization-influencing optical elements has a constant thickness.

8. An optical system according to claim 1, wherein the thickness of at least one of the first and second polarization-influencing optical elements is such that, during use of the optical system, at least one of the first and second polarization-influencing optical elements produce a rotation of a polarization direction of linearly polarized light through 90° or an odd multiple thereof.

9. An optical system according to claim 1, wherein the optical system has an optical system axis, and the first and second polarization-influencing optical elements are arranged in direct succession along the optical system axis.

10. An optical system according to claim 1, wherein the optical system has an optical system axis, the optically active material is an optically active crystal material having an optical crystal axis, and the optical crystal axis is parallel to the optical system axis.

11. An optical system according to claim 1, wherein the optically active material comprises a material selected from the group consisting of quartz, $TeO_2$ and $AgGaS_2$.

12. An optical system according to claim 1, wherein there is at least one neutral position of the polarization-influencing optical arrangement, and, during use of the optical system, the first and second polarization-influencing optical elements leave a polarization state of light passing through the arrangement substantially unaltered.

13. An optical system according to claim 1, wherein there is at least one position of the polarization-influencing optical arrangement in which, during use of the optical system, a desired polarization direction of linearly polarized light impinging on the arrangement is rotated through 90°.

14. An optical system according to claim 1, wherein the first and second polarization-influencing optical elements are arranged in such a way that their optically effective surface in a beam path of the optical system is respectively in the form of a sector of a circle.

15. An optical system according to claim 1, wherein the polarization-influencing optical arrangement comprises more than two polarization-influencing optical elements.

16. An optical system according to claim 15, wherein at least two of the polarization-influencing optical elements have different thicknesses from each other.

17. An optical system according to claim 1, wherein the optically effective surfaces of the first and second polarization-influencing optical elements completely overlap in a light propagation direction in at least one rotational position.

18. An optical system according to claim 1, wherein the optically effective surfaces of the first and second polarization-influencing optical elements in at least one rotational position supplement each other to afford a circular overall area.

19. An optical system according to claim 1, wherein the polarization-influencing optical arrangement in at least one position of the first and second polarization-influencing optical elements converts an entrance polarization distribution with a constant polarization direction into an approximately tangential polarization distribution.

20. An optical system according to claim 1, wherein the polarization-influencing optical arrangement is arranged at least in the immediate proximity of a pupil plane of the optical system.

21. An optical system according to claim 1, wherein the optical system has an optical system axis, and the polarization-influencing optical arrangement has a further optical element comprising birefringent crystal material having an optical crystal axis which is oriented perpendicularly to the optical system axis of the optical system.

22. An optical system according to claim 21, wherein the further optical element is rotatable about the optical system axis of the system.

23. An optical system according to claim 21, wherein the further optical element comprises at least one lamda/4-plate.

24. An optical system according to claim 21, wherein the further optical element comprises a matrix-like arrangement of lamda/4-plates, and optical crystal axes in at least two adjacent lamda/4-plates of the arrangement are rotated through 90° relative to each other.

25. An optical system according to claim 21, wherein the further optical element is arranged only in a region of a light beam passing through the polarization-influencing optical arrangement during use of the optical system.

26. An optical system according to claim 21, wherein the further optical element has a circular geometry.

27. An optical system according to claim 21, wherein the further optical element has a diameter which is in the range of 40% to 60% of a diameter of a light beam passing therethrough during use of the optical system.

28. The optical system of claim 1, wherein:
the optical system is an illumination system of a microlithographic projection exposure apparatus;
different illumination settings are settable in the illumination system; and
a polarization distribution present in the illumination system can be adapted to the respectively set illumination setting by rotation of the at least one of the first and second polarization-influencing optical elements which is rotatable.

29. An optical system according to claim 28, wherein the illumination settings differ by the size and/or the shape of illumination poles produced, and the polarization distribution is continuously adaptable to the size and/or the shape of the illumination poles.

30. An optical system according to claim 28, wherein at least one of the illumination settings is an annular illumination setting.

31. An optical system according to claim 28, wherein the at least one of the first and second polarization-influencing optical elements which is rotatable comprises optically active material.

32. A method, comprising:
rotating the at least one of the first and second polarization-influencing optical elements which is rotatable in the optical system of claim 28 to set a polarization distribution in at least one illumination pole.

33. An optical system according to claim 1, wherein the optical system is an illumination system of a microlithographic projection exposure apparatus, different illumination settings are settable in the illumination system, and a polarization distribution present in the illumination system is adaptable to the respectively set illumination setting by rotation of both of the first and second polarization-influencing optical elements.

34. A method, comprising:
rotating at least one of the first and second polarization-influencing optical elements in the optical system of claim 1 to set a polarization distribution in at least one illumination pole.

35. An apparatus, comprising:
an illumination system; and
a projection objective,
wherein:
the apparatus is a microlithographic projection exposure apparatus;
the illumination system and/or the projection objective comprise:
a polarization-influencing optical arrangement that comprises first and second polarization-influencing optical elements comprising optically active material, and at least one of the first and second polarization-influencing elements is rotatable so that the polarizing-influencing arrangement has a first position and a second position;
in the first position of the polarization-influencing optical arrangement, the first and second polarization-influencing optical elements have a first rotational positioning relative to each other;
in the second position of the polarization-influencing optical arrangement, the first and second polarization-influencing optical elements have a second rotational positioning relative to each other;
the first rotational positioning is different from the second rotational positioning;
during use of the optical system a light beam passes through the polarization-influencing optical arrangement;
in the first position of the polarization-influencing arrangement, a cross-section of an entire portion of the light beam passing through both the first and second polarization-influencing optical elements has a first size; and
in the second position of the polarization-influencing arrangement, a cross-section of an entire portion of the light beam passing through both the first and second polarization-influencing optical elements has a second size which is different from the first size.

36. A method, comprising:
rotating at least one of the first and second polarization-influencing optical elements in the apparatus of claim 35 to set a polarization distribution in at least one illumination pole.

\* \* \* \* \*

UNITED STATES PATENT AND TRADEMARK OFFICE
CERTIFICATE OF CORRECTION

PATENT NO. : 9,274,435 B2
APPLICATION NO. : 12/415173
DATED : March 1, 2016
INVENTOR(S) : Nils Dieckmann and Damian Fiolka It is certified that error appears in the above-identified patent and that said Letters Patent is hereby corrected as shown below:

Specification

Col. 9, line 20, delete "(FIG. 7a, b)" and insert -- (FIGS. 7a, b) --.

Col. 9, line 21, delete "(FIG. 7c, d respectively)," and insert -- (FIGS. 7c, d respectively), --.

Col. 10, line 6, delete "aforethe" and insert -- aforementioned --.

Signed and Sealed this
Fifth Day of July, 2016

Michelle K. Lee
*Director of the United States Patent and Trademark Office*